United States Patent
Wong et al.

(10) Patent No.: US 11,650,656 B1
(45) Date of Patent: May 16, 2023

(54) LOW-POWER VOLTAGE DETECTOR FOR LOW-VOLTAGE CMOS PROCESSES

(71) Applicant: Hong Kong Applied Science and Technology Research Institute Company Limited, Hong Kong (HK)

(72) Inventors: Wai Po Wong, Hong Kong (HK); Huimin Guo, Hong Kong (HK); Yat Tung Lai, Hong Kong (HK)

(73) Assignee: Hong Kong Applied Science and Technology Research Institute Company Limited

( * ) Notice: Subject to any disclaimer, the term of this patent is extended or adjusted under 35 U.S.C. 154(b) by 0 days.

(21) Appl. No.: 17/724,635

(22) Filed: Apr. 20, 2022

(51) Int. Cl.
| | |
|---|---|
| *G05F 1/571* | (2006.01) |
| *G05F 3/10* | (2006.01) |
| *G05F 3/18* | (2006.01) |
| *G06F 1/3296* | (2019.01) |
| *G05F 3/24* | (2006.01) |
| *G01R 31/36* | (2020.01) |
| *G01R 19/10* | (2006.01) |
| *G01R 31/26* | (2020.01) |
| *H02H 9/00* | (2006.01) |

(52) U.S. Cl.
CPC ........... *G06F 1/3296* (2013.01); *G01R 19/10* (2013.01); *G01R 31/2632* (2013.01); *G01R 31/3648* (2013.01); *G05F 3/247* (2013.01); *H02H 9/008* (2013.01); *G05F 1/571* (2013.01); *G05F 3/10* (2013.01); *G05F 3/18* (2013.01)

(58) Field of Classification Search
CPC ... G05F 1/571; G05F 3/10; G05F 3/18; G05F 3/247
See application file for complete search history.

(56) References Cited

U.S. PATENT DOCUMENTS

| | | | |
|---|---|---|---|
| 4,341,988 | A | 7/1982 | Small |
| 4,833,342 | A | 5/1989 | Kiryu et al. |

(Continued)

FOREIGN PATENT DOCUMENTS

| | | |
|---|---|---|
| CN | 103941797 A | 7/2014 |
| JP | 2010197160 A | 9/2010 |
| JP | 2014157035 A | 8/2014 |

OTHER PUBLICATIONS

ISR and Written Opinion, PCT/CN2022/088894, dated Dec. 27, 2022, Dec. 26, 2022.

*Primary Examiner* — Gary A Nash
(74) *Attorney, Agent, or Firm* — JPatent LLC; Stuart T. Auvinen (57) ABSTRACT

A voltage detector has a diode ladder with one or more diodes connected in series between a battery voltage input and an upper measuring node. A measuring diode is connected between the upper measuring node and a lower measuring node. A resistor and a power-down switch are connected in series between the lower measuring node and a ground. An analog input to an Analog-to-Digital Converter (ADC) is connected by a switch to the upper measuring node to generate an upper digital value. Then the switch connects the analog input to the lower measuring node to generate a lower digital value. The difference between the upper and lower digital values is the diode voltage drop across the measuring diode and is multiplied by a number of diodes in the diode ladder and added to the upper digital value to generate a battery voltage measurement.

20 Claims, 6 Drawing Sheets

(56) References Cited

U.S. PATENT DOCUMENTS

| | | |
|---|---|---|
| 5,814,995 A | 9/1998 | Tasdighi |
| 6,362,627 B1 | 3/2002 | Shimamoto |
| 6,462,550 B2 | 10/2002 | Yudahira |
| 7,663,375 B2 | 2/2010 | Yonezawa |
| 2008/0197910 A1* | 8/2008 | Isomura .............. B60H 1/00428 327/520 |
| 2010/0214710 A1* | 8/2010 | Kora .................. G01R 19/0084 361/101 |
| 2013/0127515 A1 | 5/2013 | Yu et al. |
| 2015/0002179 A1* | 1/2015 | Akebono ......... G01R 19/16538 324/713 |
| 2016/0377685 A1* | 12/2016 | Makino ................ H03K 17/693 324/434 |
| 2018/0123591 A1* | 5/2018 | Gorbold ......... H03K 19/018507 |
| 2020/0278708 A1* | 9/2020 | Tesch ..................... G05F 1/575 |

* cited by examiner

PRIOR ART

LOW-POWER VOLTAGE DETECTOR FOR LOW-VOLTAGE CMOS PROCESSES

FIELD OF THE INVENTION

This invention relates to voltage detectors, and more particularly to battery-voltage detectors measuring a diode's terminal voltages.

BACKGROUND OF THE INVENTION

Battery-powered devices may include Integrated Circuits (ICs) that contain semiconductor devices such as transistors. More advanced semiconductor processes produce transistors that can be damaged by higher applied voltages. Smaller batteries can power advanced low-power ICs that have reduced power-supply voltages and transistors that can be damaged by voltages as low as the battery voltage. Thus the battery voltage must be reduced or applied to several transistors in series to reduce the voltage applied to any individual transistor.

Figure 1:
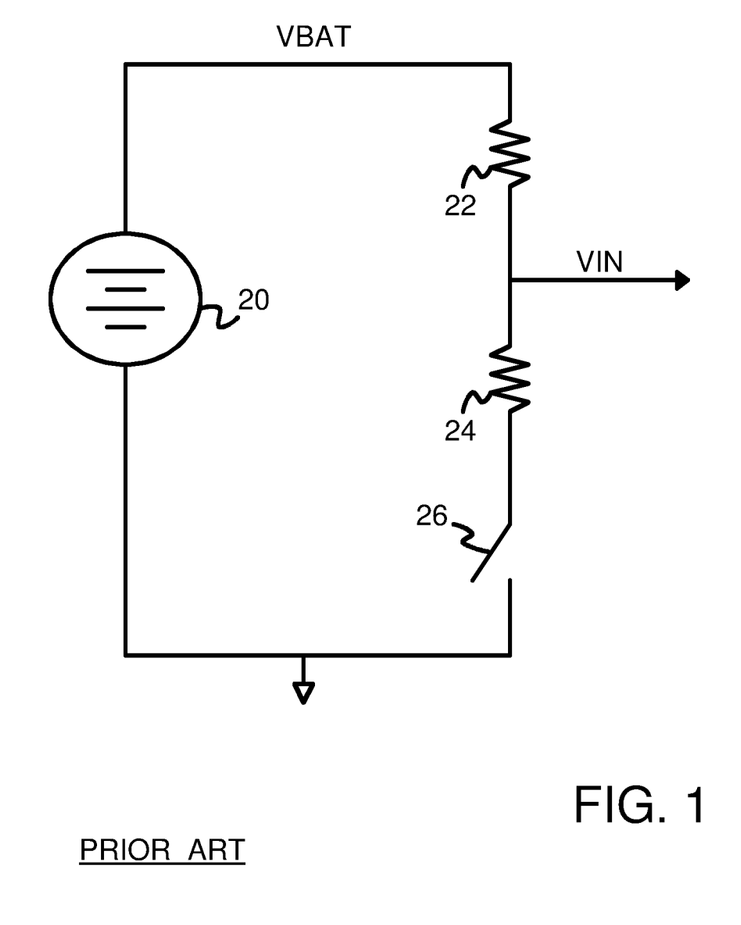
FIG. 1 shows a resistor voltage divider.

FIG. 1 shows a resistor voltage divider. Battery 20 generates a battery voltage VBAT at its positive terminal relative to its ground terminal. Resistors 22, 24 are in series with each other and switch 26 between VBAT and ground. When switch 26 is closed, current I from battery 20 passes through resistors 22, 24, causing V=IR voltage drops in each of resistor 22, 24 that is proportional to each resistor's resistance R. When resistors 22, 24 have the same resistance R, the node between resistors 22, 24, voltage VIN, is half of the battery voltage, or VIN=VBAT/2.

VIN can safely be applied to transistors or other delicate semiconductor devices when switch 26 is closed and VBAT is divided by resistors 22, 24. For example, VIN could be used to indirectly measure the battery voltage. However, the current I through resistors 22, 24 may cause an unwanted power drain from battery 20. Switch 26 can be opened to interrupt the current flow and reduce power when measuring the battery voltage is not being performed.

However, when switch 26 is opened, current from battery 20 momentarily flows through resistor 22 and charges VIN until VIN reaches VBAT. Any transistors connected to VIN have the higher VBAT voltage applied when switch 26 is open. These transistors can be damaged when switch 26 is open since VIN can equal or approach VBAT.

For example, VBAT may be 1.5 to 4.2 volts, causing VIN to be in a safe range of 0.75 to 2.1 volts when switch 26 is closed and equal resistances R are used, but 1.5 to 4.2 volts when switch 26 is open. Some transistors or other devices may be damaged by 3 or 4 volts. Thus a resistor voltage divider with a power-down switch may damage sensitive transistors or other devices.

Figure 2:
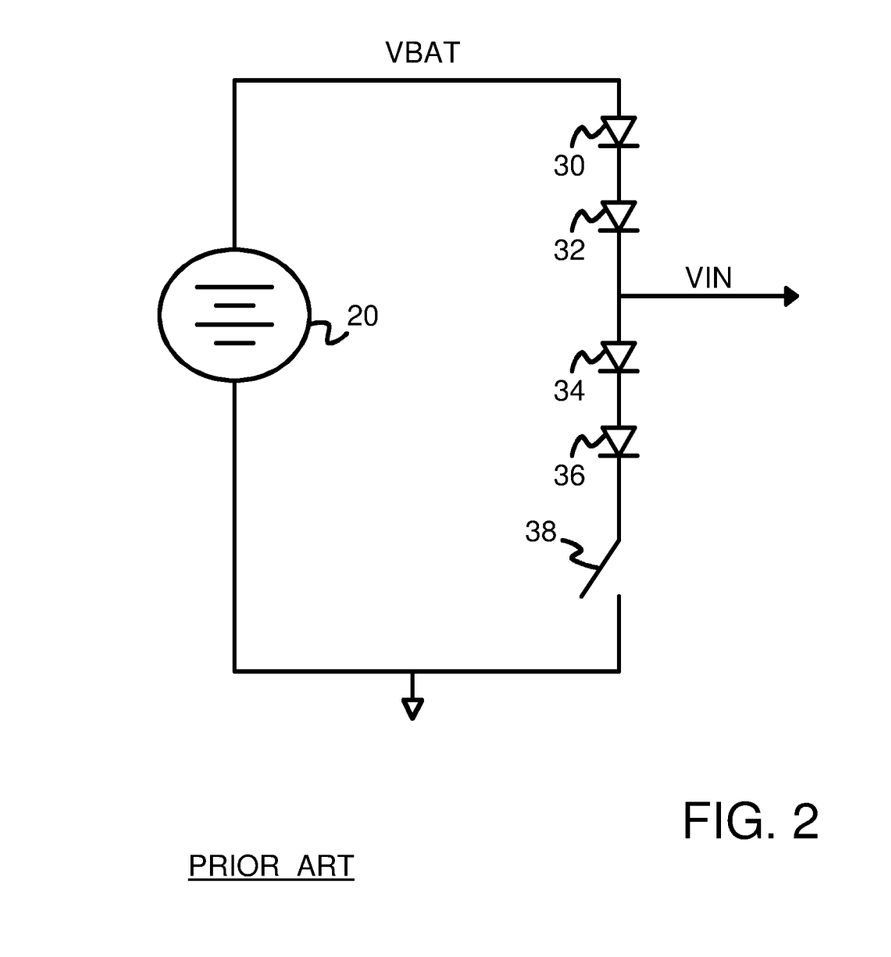
FIG. 2 shows a diode voltage divider.

FIG. 2 shows a diode voltage divider. A series of diodes 30, 32, 34, 36 are in series with each other and with switch 38. When switch 38 is closed, current flowing through each of diodes 30, 32, 34, 36 causes a pn-junction voltage drop Vpn of about 0.5-0.7 volt per diode.

In FIG. 2 VIN is located between diodes 32, 34, and there are two diode-voltage drops caused by diodes 30, 32 between VBAT and VIN, so VIN=VBAT−2*Vpn, or about 1 to 1.4 volts below VBAT.

When switch 38 is opened to save power, any momentarily current flowing through diode 30 stops when the lower terminal of diode 30 rises above VBAT−Vpn. Likewise, current through diode 32 stops when the voltage across its terminals is less than Vpn. Thus VIN cannot rise above VBAT−2*Vpn when switch 38 is opened.

VIN can be connected to sensitive devices such as transistors, since diodes 30, 32 prevent VIN from rising above VBAT−2*Vpn. Switch 38 can be opened to reduce current and power when VIN is not being sampled or otherwise used.

However, unlike resistors 22, 24, that have an exact resistance value R, the voltage drop Vpn through diodes 30, 32 can vary with process, supply voltage, and temperature (PVT) conditions. Also, a fairly large current may flow through diodes 30, 32, 34, 36, increasing power consumption.

A low-power device that runs on battery power may be placed in standby mode for long periods of time to extend the battery lifetime. It is important to be able to power down a voltage detector to prevent battery drain. Advanced semiconductor processes can be so sensitive to damage that the battery voltage may cause damage. For example, a 4.2-volt battery exceeds a 3.3-volt limit for some advanced CMOS processes.

What is desired is a voltage detector that can be powered down. A voltage detector that protects sensitive devices such as low-power transistors from damage during power-down mode is desired. A voltage detector that can read the battery voltage while protecting low-supply-voltage semiconductor processes transistors is desirable.

DETAILED DESCRIPTION

The present invention relates to an improvement in battery-voltage detectors. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that a diode ladder can provide protection to sensitive circuits by ensuring that a higher battery voltage is stepped down in voltage before being applied to sensitive circuits. Even when the diode ladder is powered down, protection is provided.

The inventors further realize that diode voltage drops are sensitive to process and other PVT variations, so a single voltage measurement might not accurately measure a battery voltage. However, all diodes in a diode ladder should track each other and have the same diode voltage drop. The inventors measure voltage at both terminals of a diode in the diode ladder, and then multiply this measured diode voltage drop by the number of diodes in the diode ladder to estimate the battery voltage at the top of the diode ladder.

Figure 3:
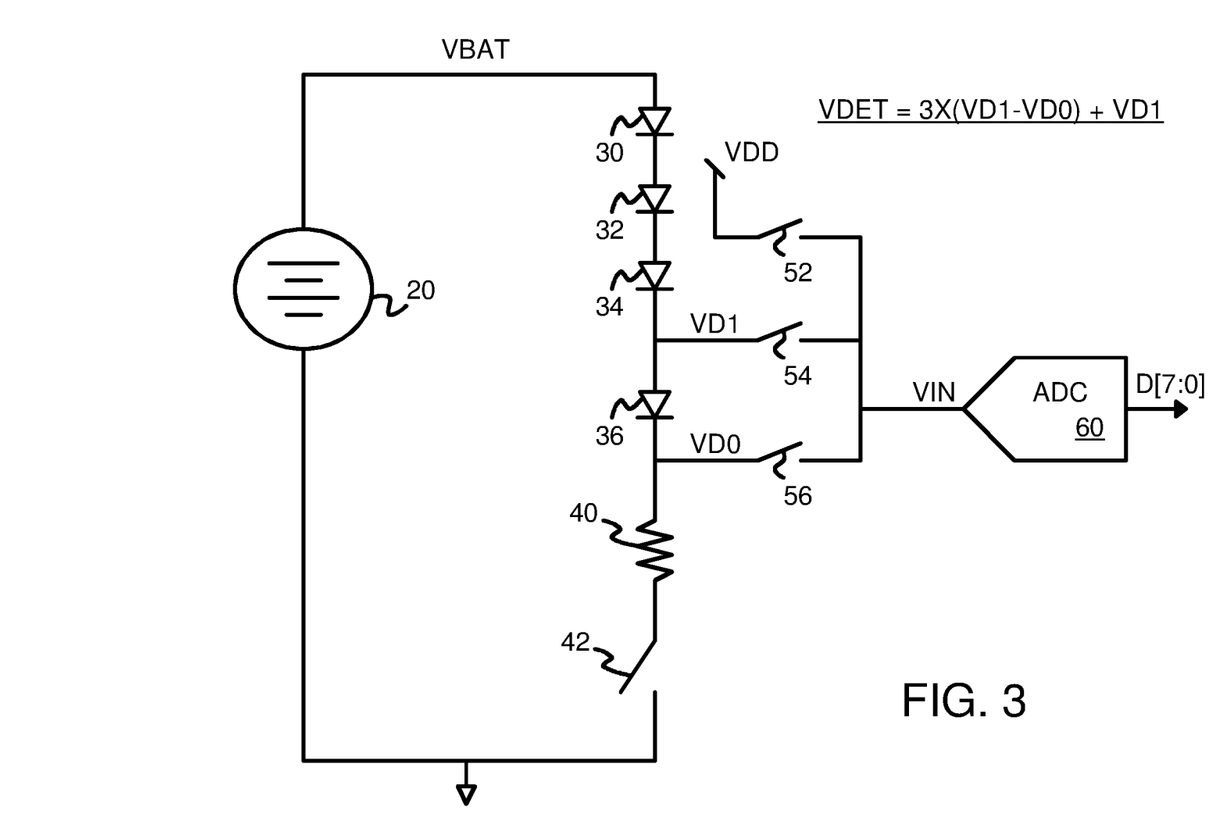
FIG. 3 is a block diagram of a simplified battery voltage detector measuring voltages at two points in a diode ladder.

FIG. 3 is a block diagram of a simplified battery voltage detector measuring voltages at two points in a diode ladder. Battery 20 generates battery voltage VBAT that is applied to the top of a diode tree of diodes 30, 32, 34, 36, that are in series with resistor 40 and switch 42. Resistor 40 limits the ON current while switch 42 opens to power down the battery detector.

Diode 36 has upper terminal VD1 and lower terminal VD0. Rather than measure a single voltage, two voltages are measured, for VD1 and VD0. Analog-to-Digital Converter (ADC) 60 measures the voltage VD1 when switch 54 is closed but measures the voltage VD0 when switch 56 is closed. ADC 60 may contain delicate semiconductor components such as precision capacitors or resistors and transistor switches that could be damaged if battery voltage VBAT were directly applied to input VIN to ADC 60. Diodes 30, 32, 34 reduce VBAT by three diode voltage drops to provide a lower, safer VIN to ADC 60.

ADC 60 converts an analog input voltage VIN to a digital value D[7:0]. Only one of switches 52, 54, 56 is closed at any particular time. Switch 54 closes to connect VIN to VD1, while switch 56 closes to connect VIN to VD0. Switch 52 closes to drive VDD to VIN to idle, reset, auto-zero, or offset calibrate ADC 60 between measurements.

By measuring the voltages of both VD1 and VD0, the voltage across diode 36 can be determined by the difference VD1−VD0. This voltage difference VD1−VD0 is the diode voltage drop. This diode voltage drop varies with process, temperature, and voltage, but should be the same for all diodes on a particular device that are fabricated together and have about the same size, geometry, and orientation. Thus when diodes 30, 32, 34, 36 are designed to have the same size, geometry, and orientation, they should have the same voltage drop when a current flows through them in series.

The total voltage drop across upper diodes 30, 32, 34 is simply three times the voltage drop measured for diode 36, or 3×(VD1−VD0). Since VD1 is the voltage between diode 34 and diode 36, and battery voltage VBAT is the top voltage of diode 30, VBAT can be calculated as:

$$VBAT=3\times(VD1-VD0)+VD1$$

In general, when there are N diodes between VBAT and VD1, $$VBAT=N\times(VD1-VD0)+VD1$$

Thus the battery voltage can be determined from two voltage measurements, VD1, and VD0. The battery voltage is obtained by multiplying the measured voltage drop across diode 36 by the number of diodes between diode 36 and battery 20.

Figure 4:
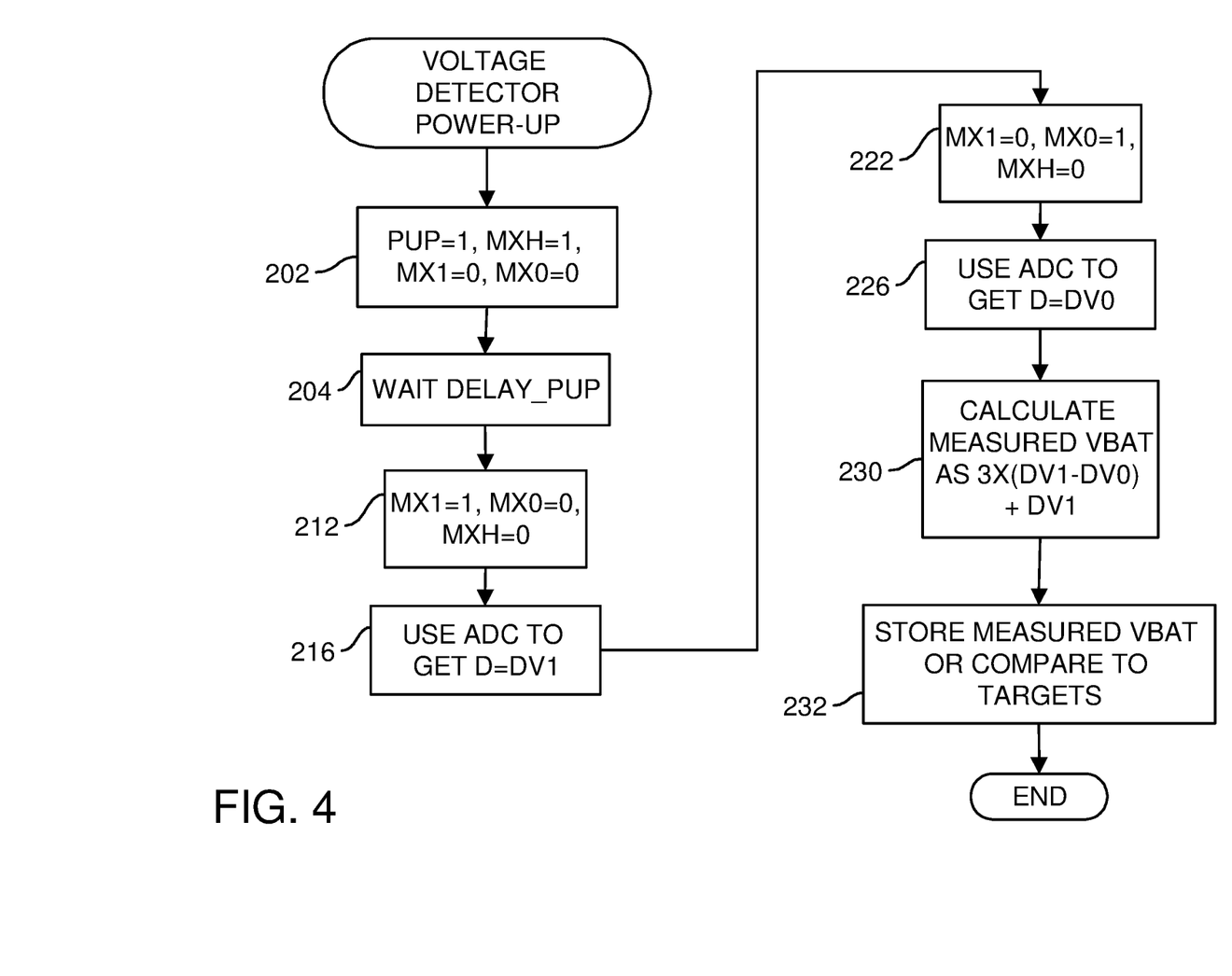
FIG. 4 is a flowchart of a battery voltage detection routine using the battery voltage detector of FIG. 3.

FIG. 4 is a flowchart of a battery voltage detection routine using the battery voltage detector of FIG. 3. When the voltage detector is instructed to power up and take measurements, switch 42 is closed by power-up signal PUP going high, step 202. Signal MXH is high closing switch 52 to drive VDD to ADC 60 to preset it, while signals MH1 and MX0 are low to keep switches 54, 56 open.

After a power-up delay PUP has expired, step 204, then switches 52, 54, 56, controlled by signals MXH, MX1, MX0, respectively, change to open switches 52, 56 and close switch 54 to connect VD1 to VIN and ADC 60, step 212. MX1 is high and MXH, MX0 are low in step 212.

ADC 60 measures VIN=VD1 and converts this analog voltage to a digital value D[7:0], step 216, which is stored as digital voltage DV1.

Then MX0 is drive high and MX0 and MXH driven low, step 222, to close switch 56 and open switches 52, 54. ADC 60 measures VIN=VD0 and converts this analog voltage to a digital value D[7:0], step 226, which is stored as digital voltage DV0.

An Arithmetic-Logic-Unit (ALU) or other microprocessor or programmed logic then calculates the measured battery voltage VBAT as a digital value DVBAT, step 230. The difference DV1−DV0 is multiplied by the number N of diodes between VD1 and VBAT, and then added to DV1, or $$DVBAT=N\times(DV1-DV0)+DV1$$

For the circuit of FIG. 3 where N is 3:

$$DVBAT=3\times(DV1-DV0)+DV1$$

The digital value DVBAT of the battery voltage calculated from the 2 voltage measurements across diode 36 can then be stored, step 232. This value DVBAT can be compared to targets such as voltage limits an used to signal a power failure when DVBAT falls below a lower limit, or an over-voltage alarm when DVBAT is above an upper limit.

The battery voltage detector can then be powered down by driving PUP low (not shown) to open switch 42, or left on to repeat measurements.

Figure 5:
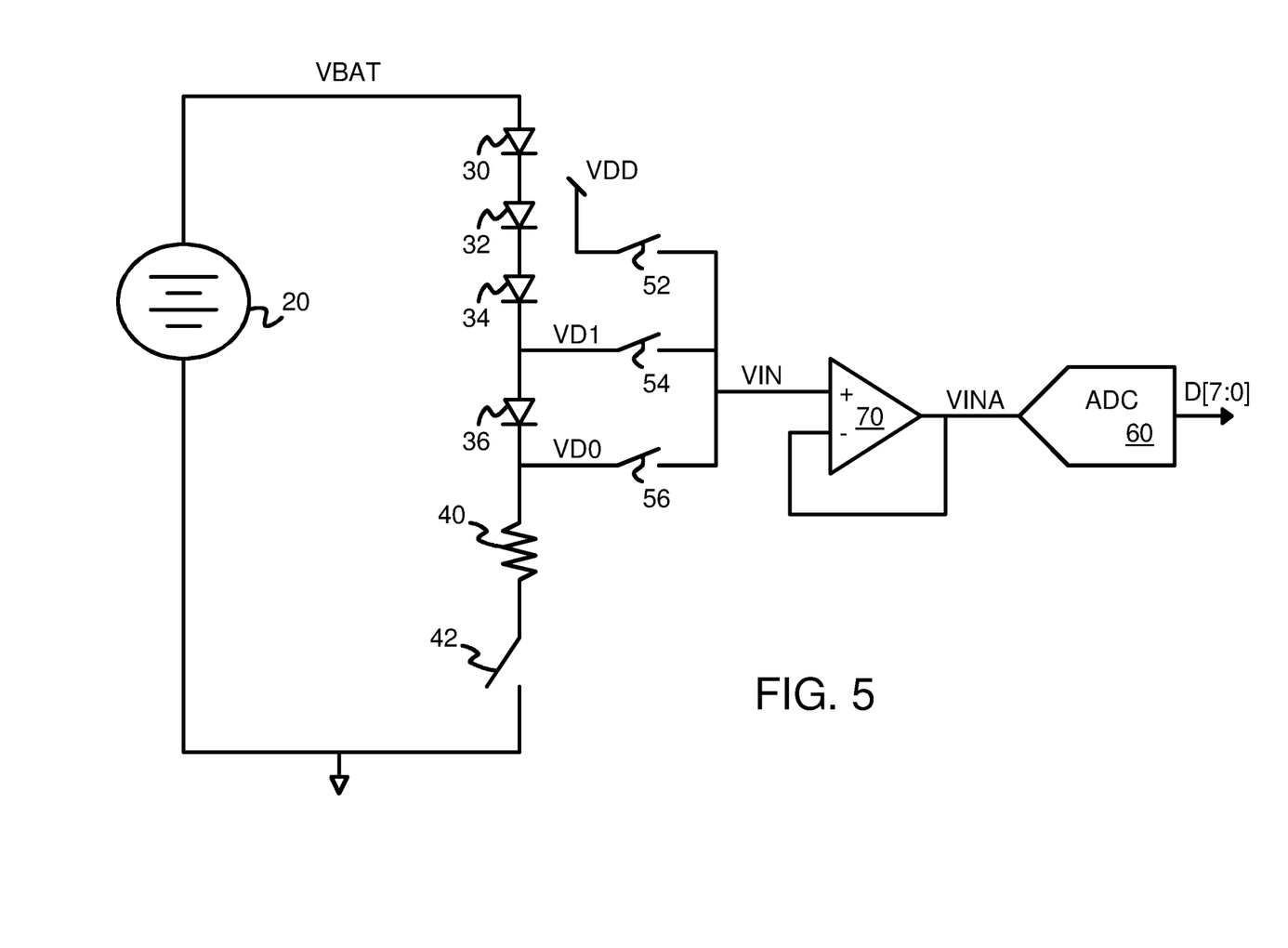
FIG. 5 is a block diagram of a buffered battery voltage detector measuring voltages at two points in a diode ladder.

FIG. 5 is a block diagram of a buffered battery voltage detector measuring voltages at two points in a diode ladder. In this alternative, the analog input to ADC 60 is buffered by op amp 70. Op amp 70 receives VIN on its non-inverting (+) input and has its output VINA fed back to its inverting (−) input. Op amp 70 can be a unity gain buffer.

Op amp 70 buffers VIN, which can have voltage changes due to charge sharing as switches 52, 54, 56 switch. The input to ADC 60 may have small, sensitive capacitances. ADC 60 input VINA is protected from charge sharing and switch noise on VIN by op amp 70.

Figure 6:
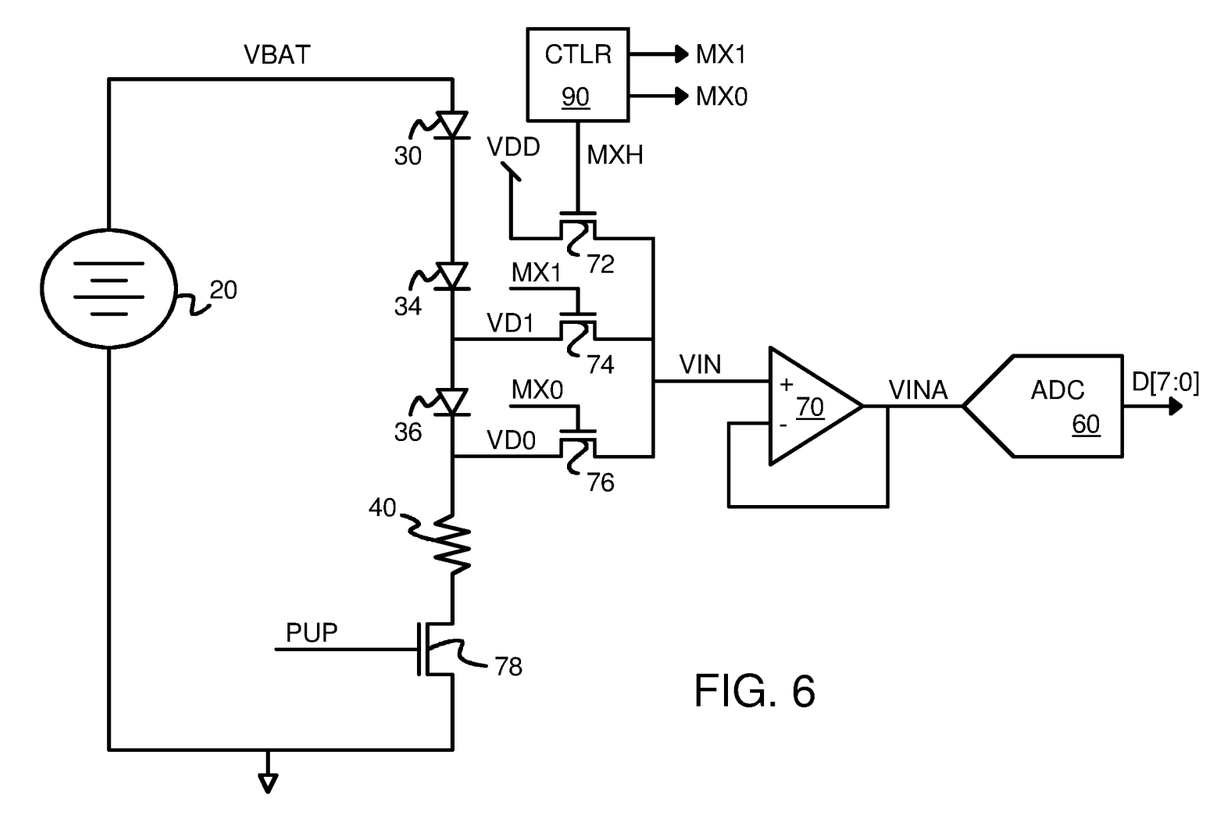
FIG. 6 is a block diagram of a transistor-switched battery voltage detector measuring voltages at two points in a diode ladder.

FIG. 6 is a block diagram of a transistor-switched battery voltage detector measuring voltages at two points in a diode ladder. In this alternative, switch 42 is implemented by transistor 78. Transistor 78 can be an n-channel MOS transistor with a gate driven by the power-up signal PUP, and a channel between resistor 40 and ground. N-channel MOS transistors have a very low leakage current, providing good isolation when the switch is closed.

Switches 52, 54, 56 are also implemented as n-channel transistors. Transistor 72 has a gate driven by control signal MXH and a channel connecting VDD to VIN. Transistor 74 has a gate driven by control signal MX1 and a channel connecting VD1 to VIN. Transistor 76 has a gate driven by control signal MX0 and a channel connecting VD0 to VIN. Control signals MXH, MX1, MX2 can be generated by controller 90 or even be software-controlled, such as by software writing a 1 or a 0 to I/O registers that drive MXH, MX1, MX0.

Also in this alternative, diode 32 has been deleted, so that only 2 diodes 30, 34 are between measuring diode 36 and VBAT. In this variation N=2 and VBAT can be calculated by controller 90 or by a processor or other component as:

$$VBAT=2\times(VD1-VD0)+VD1$$

ALTERNATE EMBODIMENTS

Several other embodiments are contemplated by the inventors. For example additional diodes or diode-connected transistors may be inserted, such as in series between diode 36 and resistor 40. The order of components in series may be adjusted, such as by having resistor 40 connect to ground and switch 42 connect between the upper terminal of resistor and diode 36.

While single-pole transistor switches have been shown, a multi-pole switch, mux, or network of switches could be used to connect VD0, VD1, or VDD to the ADC. These more complex switches may be themselves be composed of multiple simple switches and various logic or controls. Thus a single multi-pole switch may in reality be equivalent to several single-pole switches. The switches could each be implemented as an n-channel transistor, or could be transmission gates, each with an n-channel and a p-channel transistor in parallel. While n-channel transistors have been described, p-channel transistors could also be used with inverted gate signals.

There may be different numbers of diodes between measuring diode 36 and VBAT, such as the three diodes 30, 32, 34 as shown in FIGS. 3, 5, or only 2 diodes 30, 34 as shown in FIG. 6. The upper diode ladder may have N diodes in series between VBAT and VD1, where N is a whole number of at least 1.

While a battery voltage detector has been described, the voltage detector could measure other voltages that are not generated by a battery. The battery voltage could be generated by multiple cells in a battery or by multiple batteries. The voltage detector could measure a power voltage generated by a power supply that could be switched from a battery to a transformer or other power converter.

Diodes 30, 32, 34, 36 can be pn semiconductor diodes where the upper terminal is connected to a p-type doped region that abuts an n-type doped region in the same semiconductor substrate, such as in an Integrated Circuits (IC) chip. Diodes formed in the same semiconductor substrate should have the same pn junction doping profiles when their designs and geometries are matched and thus have closely-matched device characteristics such as forward-bias diode voltage drops. Diodes under forward bias generally follow the ideal diode equation, where forward current rises exponentially with voltage near the diode turn-on voltage. This exponential current can be approximated as an on-off switch with a voltage drop of the pn junction turn-on voltage. This pn junction voltage at turn on can be seen in a graph as a knee voltage where the current-voltage curve bends sharply upward.

While a Complementary Metal-Oxide-Semiconductor (CMOS) process has been described, other processes and materials could be used. Different semiconductor materials will have different pn junction turn-on voltages. For example, silicon has a pn junction voltage of 0.5-0.7 volts, but Gallium-Arsenide has a lower pn junction voltage of about 0.3 volts. Since all of diodes 30, 32, 34, 36 are made from the same semiconductor substrate, they will all have the same pn junction turn-on voltage, and have the same diode voltage drop.

While pn junction diodes have been described, other diode technologies could be used, such as Schottky diodes, metal-ohmic contacts, etc. Many variations of IC semiconductor manufacturing processes are possible.

Terms such as up, down, above, under, horizontal, vertical, inside, outside, upper, lower, top, bottom, etc., are relative and depend on the viewpoint and are not meant to limit the invention to a particular perspective. Devices may be rotated so that vertical is horizontal and horizontal is vertical, so these terms are viewer dependent. As long as the two directions are substantially perpendicular to each other, one line or direction can be considered to be vertical and the other considered to be horizontal.

While an ADC that converts an analog voltage to a digital value has been described, an analog current could also be converted to the digital value. The analog current could be passed through a resistor to generate the analog voltage for input to the ADC. Alternatively, the ADC may convert an analog current as its input. A voltage-controlled current source could convert an analog voltage input to the analog current input for such an ADC. Many kinds and variations of ADC's are possible.

The process of FIG. 4 could be performed by a program executing on a computer or processor, such as a software program, or by a firmware routine, or by hardwired logic such as a sequencer or state machine, or by various combinations. For example, the calculation in step 230 could be performed by a higher-level microprocessor while hardware control of switches 52, 54, 56 and activation of ADC 60 could be handled by hardware.

Some steps in the process of FIG. 4 could be performed in parallel with other steps, or in a different sequence or order. For example, VD0 could be measured before VD1. A second ADC with separate switches could allow both VD0 and VD1 to be measured at the same time.

While using the ADC to measure the voltage drop across one diode has been shown, more measurements could be taken and the results averaged together, or outlier results deleted. For example, ADC 60 could also measure the voltage between diodes 32, 34 if another switch connected VIN to this node. The measured voltage drop across diode 34 and across diode 36 could be averaged together and then used as the diode voltage drop in further calculations.

While switch 52 has been shown as connecting VIN to the power supply voltage VDD, switch 52 could instead connect VIN to ground, or to a common-mode voltage VCM of VDD/2, or to some other voltage. Some embodiments may eliminate switch 52, or ADC 60 may contain internal switches to pre-charge or initialize its internal analog input. ADC 60 could be a switched-capacitor ADC, a flash ADC, or other kinds of ADC. The number of digital bits in the output of ADC 60 has been describes as 8, but other bit widths or resolutions such as 6 bits, 10 bits, etc., could be substituted. The battery voltage could have a variety of values, and additional components such as supply capacitors, diodes, power switches, monitors, or power filters could be attached to battery 20.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A voltage detector comprising:
a diode ladder having one or more diodes connected in series between a voltage input and an upper measuring node;
a measuring diode connected between the upper measuring node and a lower measuring node;
a resistor and a power-down switch connected in series between the lower measuring node and a ground;
an Analog-to-Digital Converter (ADC) having an analog input and a digital output having a digital value that represents a voltage of the analog input;
a first switch that connects the upper measuring node to the ADC, the ADC generating an upper digital value representing a voltage of the upper measuring node;
a second switch that connects the lower measuring node to the ADC, the ADC generating a lower digital value representing a voltage of the lower measuring node; and
a controller that generates a calculated voltage measurement by generating a difference of the upper digital value and the lower digital value, and multiplying the difference by a number of diodes in the diode ladder to generate a product, and adding the product to the upper digital value to generate the calculated voltage measurement,
whereby a voltage across the measuring diode is measured and used to calculate the calculated voltage measurement.

2. The voltage detector of claim 1 wherein the diode ladder comprises an upper diode and a lower diode in series;
wherein the controller multiplies the difference by two to generate the product.

3. The voltage detector of claim 1 wherein the diode ladder comprises an upper diode and a middle diode and a lower diode in series;
wherein the controller multiplies the difference by three to generate the product.

4. The voltage detector of claim 3 wherein the one or more diodes in the diode ladder and the measuring diode each comprise a pn junction diode, wherein the one or more diodes in the diode ladder and the measuring diode are formed together in a semiconductor substrate.

5. The voltage detector of claim 4 wherein the one or more diodes in the diode ladder and the measuring diode are matched during design to have a same size and geometry.

6. The voltage detector of claim 5 wherein the one or more diodes in the diode ladder and the measuring diode are forward biased by the voltage input and the ground.

7. A voltage-measuring circuit comprising:
a voltage input;
a plurality of N diodes, wherein N is a whole number of diodes connected in series between the voltage input and a first node;
a measuring diode connected between the first node and a second node;
a resistor connected between the second node and a third node;
a power-down switch connected between the third node and a ground, the power-down switch opening to power down the voltage-measuring circuit when no voltage measurement is being made;
an Analog-to-Digital Converter (ADC) that converts a voltage of an analog input node to a digital value representing the voltage of the analog input node;
a first switch for connecting the first node to a combining node when the ADC generates the digital value as a first digital value representing a voltage of the first node;
a second switch for connecting the second node to the combining node when the ADC generates the digital value as a second digital value representing a voltage of the second node; and
a processor that receives the first digital value and the second digital value from the ADC and generates a digital estimate of a voltage of the voltage input, the processor subtracting the second digital value from the first digital value to generate a digital difference, multiplying the digital difference by N to generate a product, and adding the first digital value to the product to generate the digital estimate of the voltage of the voltage input,
whereby a voltage difference across the measuring diode is multiplied by a number of diodes in the plurality of N diodes and added to the first digital value to generate the digital estimate of the voltage of the voltage input.

8. The voltage-measuring circuit of claim 7 wherein the combining node is directly connected to the analog input node of the ADC.

9. The voltage-measuring circuit of claim 7 further comprising:
an analog buffer having the combining node as an input and the analog input node of the ADC as an output of the analog buffer.

10. The voltage-measuring circuit of claim 7 wherein each diode in the plurality of N diodes and the measuring diode each comprise a pn junction diode formed in a semiconductor substrate with other diodes in the plurality of N diodes.

11. The voltage-measuring circuit of claim 10 wherein the plurality of N diodes and the measuring diode are each forward biased by the voltage input and each has a diode voltage drop having a same value within 5%.

12. The voltage-measuring circuit of claim 7 wherein the ADC has at least 5 bits of precision, wherein the digital value generated by the ADC comprises at least 5 binary bits.

13. The voltage-measuring circuit of claim 7 wherein the measuring diode and each diode in the plurality of N diodes each comprise a diode-connected transistor having a gate and a drain connected together;
wherein the measuring diode and each diode in the plurality of N diodes are formed together in a semiconductor substrate.

14. The voltage-measuring circuit of claim 7 further comprising:
a third switch that connects a fixed voltage node to the ADC, the fixed voltage node having a fixed voltage.

15. The voltage-measuring circuit of claim 7 further comprising:
an amplifier having an input connected to the combining node, the amplifier having an output connected to the analog input node to the ADC.

16. The voltage-measuring circuit of claim 15 wherein the amplifier is an op amp, the op amp also having an inverting input that is connected to the output of the amplifier.

17. The voltage-measuring circuit of claim 7 wherein the first switch comprises a first n-channel transistor having a channel connected between the first node and the combining node, and having a control gate for isolating the first node from the combining node;
wherein the second switch comprises a second n-channel transistor having a channel connected between the second node and the combining node, and having a control gate for isolating the second node from the combining node.

18. The voltage-measuring circuit of claim 7 further comprising:
a battery connected to the voltage input;
wherein the power-down switch is opened to power down the voltage-measuring circuit to save battery power.

19. The voltage-measuring circuit of claim 18 wherein the power-down switch comprises an n-channel transistor having a channel connected in series with the resistor and having a control gate receiving a power-mode signal that causes the n-channel transistor to not conduct current from the resistor when the power-mode signal indicates a power-down mode.

20. A voltage measuring and protecting device comprising:
an Analog-to-Digital Converter (ADC) that converts an analog input node to a digital value representing a voltage of the analog input node;
wherein the digital value has at least 5 binary bits;
a voltage input for receiving an input voltage that is damaging to the ADC if directly applied to the analog input node;
a series of N diodes connected in series between the input voltage and a first node, each diode in the series of N diodes being forward biased by current from the voltage input, wherein N is a whole number;
a measuring diode connected between the first node and a second node;
a resistor and a power-down switch connected in series between the second node and a ground;
a first switch for connecting the first node to a combining node when the ADC generates the digital value as a first digital value representing a voltage of the first node;
a second switch for connecting the second node to the combining node when the ADC generates the digital value as a second digital value representing a voltage of the second node;
a buffer between the combining node and the analog input node to the ADC; and
an estimator that receives the first digital value and the second digital value from the ADC and generates a digital estimate of a voltage of the voltage input, the estimator subtracting the second digital value from the first digital value to generate a digital difference, multiplying the digital difference by N to generate a product, and adding the first digital value to the product to generate the digital estimate of the voltage of the voltage input.

* * * * *